United States Patent
Kim et al.

(10) Patent No.: US 8,004,066 B2
(45) Date of Patent: Aug. 23, 2011

(54) CRACK STOP AND MOISTURE BARRIER

(75) Inventors: Sun-Oo Kim, Hopewell Junction, NY (US); O Seo Park, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/766,709

(22) Filed: Apr. 23, 2010

(65) Prior Publication Data

US 2010/0203701 A1    Aug. 12, 2010

Related U.S. Application Data

(62) Division of application No. 11/079,737, filed on Mar. 14, 2005, now Pat. No. 7,741,715.

(51) Int. Cl.
*H01L 23/544* (2006.01)

(52) U.S. Cl. ......... 257/620; 257/E21.599; 257/E23.194; 438/462

(58) Field of Classification Search .................. None
See application file for complete search history.

(56) References Cited

U.S. PATENT DOCUMENTS

| | | | |
|---|---|---|---|
| 5,834,829 A * | 11/1998 | Dinkel et al. | 257/620 |
| 6,022,791 A | 2/2000 | Cook et al. | |
| 6,163,065 A | 12/2000 | Seshan et al. | |
| 6,271,578 B1 | 8/2001 | Mitwalsky et al. | |
| 6,365,958 B1 | 4/2002 | Ibnabdeljalil et al. | |
| 6,486,526 B1 | 11/2002 | Narayan et al. | |
| 6,495,918 B1 | 12/2002 | Brintzinger | |
| 6,841,455 B2 | 1/2005 | West et al. | |
| 7,235,864 B2 | 6/2007 | Lee | |
| 2002/0167071 A1 * | 11/2002 | Wang | 257/620 |
| 2006/0001144 A1 * | 1/2006 | Uehling et al. | 257/690 |

* cited by examiner

*Primary Examiner* — Ha Tran T Nguyen
*Assistant Examiner* — Shaka Scarlett
(74) *Attorney, Agent, or Firm* — Slater & Matsil, L.L.P.

(57) ABSTRACT

A design for a crack stop and moisture barrier for a semiconductor device includes a plurality of discrete conductive features formed at the edge of an integrated circuit proximate a scribe line. The discrete conductive features may comprise a plurality of staggered lines, a plurality of horseshoe-shaped lines, or a combination of both.

21 Claims, 3 Drawing Sheets

CRACK STOP AND MOISTURE BARRIER

This is a divisional application of U.S. patent application Ser. No. 11/079,737, entitled "Crack Stop and Moisture Barrier," filed on Mar. 14, 2005 now U.S. Pat. No. 7,741,715, which application is incorporated herein by reference.

TECHNICAL FIELD

The present invention relates generally to the manufacture of semiconductor devices, and more particularly to a crack stop and moisture barrier design.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Dozens or hundreds of integrated circuits are typically manufactured on a single semiconductor wafer. The individual die are singulated by sawing the integrated circuits along a scribe line. The individual die are then packaged, either separately or in a multi-chip module or other type of packaging, for example.

A problem that can occur in integrated circuits is that when the die are singulated, the material layers can crack proximate the scribe line, damaging the integrated circuits and leading to device failures. The cracks can disrupt conductive lines, for example, rendering the circuits inoperable. The cracks can also allow moisture and other contaminants to enter into the integrated circuit, causing corrosion, for example.

Thus, what are needed in the art are improved method of preventing cracks during the singulation process of semiconductor devices.

SUMMARY OF THE INVENTION

These and other problems are generally solved or circumvented, and technical advantages are generally achieved, by preferred embodiments of the present invention, which provide novel structures of crack prevention and moisture barriers proximate the scribe line of integrated circuits and methods of manufacture thereof.

In accordance with a preferred embodiment of the present invention, a semiconductor device includes an integrated circuit, the integrated circuit having a peripheral region proximate a scribe line. A crack prevention and moisture barrier is formed at the peripheral region of the integrated circuit. The crack prevention and moisture barrier includes a plurality of discrete conductive features.

In accordance with another preferred embodiment of the present invention, a semiconductor device includes an integrated circuit, the integrated circuit having a peripheral region, and a crack prevention structure formed proximate the peripheral region of the integrated circuit. The crack prevention structure comprises a plurality of staggered conductive lines arranged in a plurality of rows.

In accordance with yet another preferred embodiment of the present invention, a semiconductor device includes an integrated circuit, the integrated circuit having a peripheral region, and a crack prevention structure formed proximate the peripheral region of the integrated circuit. The crack prevention structure comprises a plurality of horseshoe-shaped conductive lines arranged in at least one row.

In accordance with another preferred embodiment of the present invention, a method of manufacturing a semiconductor device includes manufacturing a plurality of integrated circuits on a semiconductor wafer, each of the integrated circuits comprising a peripheral region, and forming a crack prevention structure proximate the peripheral region of each of the plurality of integrated circuits. The crack prevention structure comprises a plurality of discrete conductive features. The method includes separating the plurality of integrated circuits from one another proximate the crack prevention structure of each integrated circuit.

Advantages of preferred embodiments of the present invention include providing a novel crack stop and moisture barrier that is easily implemented into semiconductor designs. Because the crack stop comprises a plurality of discrete features, etch processes to form the crack stop are readily implemented into manufacturing processes. Chemical mechanical polishing (CMP) dishing around the chip edge area is reduced. Integrated circuits with good quality and high reliability result from the use of the novel crack stop and moisture barrier designs described herein.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a crack prevention (also referred to herein as a crack stop) and moisture barrier structure for semiconductor devices. The invention may also be applied, however, to other applications where crack prevention structures are required, for example. The crack prevention structures described herein are preferably formed in metallization layers of an integrated circuit, although they may also be implemented in semiconductive material layers or insulating material layers, for example.

Figure 1:
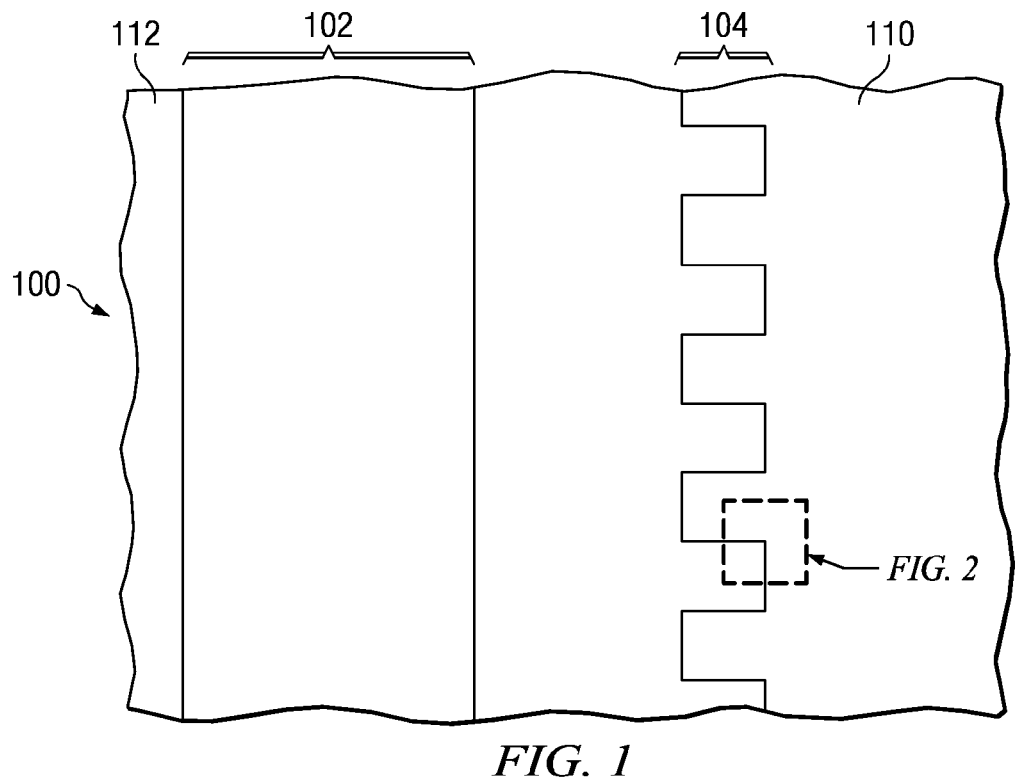
FIG. 1 shows a top view of a less preferred embodiment of the present invention, which includes a moisture barrier comprising a dual line structure and a crack stop that comprises a jagged line.

With reference now to FIG. 1, there is shown a top view of a less preferred embodiment of the present invention, wherein a semiconductor device 100 includes a moisture barrier 102 comprising a dual line structure and a crack stop 104 that comprises a jagged, sawtooth, or zigzag line. The moisture barrier 102 is formed proximate a scribe line 112 or scribe region of an integrated circuit. The moisture barrier 102 is spaced apart from the crack stop 104 by a predetermined distance. The crack stop 104 is positioned proximate an active area 110 of the integrated circuit, e.g., where active circuitry is formed. The crack stop 104 and the moisture barrier 102 are designed to prevent cracks in the material layers of the device 100 during the singulation process, and also to prevent moisture from reaching and contaminating the material layers of the device 100.

Figure 2:
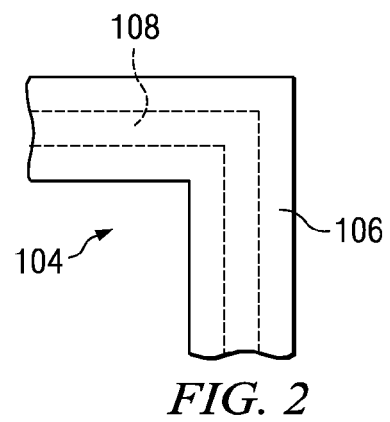
FIG. 2 is a more detailed view of the crack stop shown in FIG. 1.

FIG. 2 is a more detailed view of the crack stop 104 shown in FIG. 1. The jagged line of the crack stop 104 may comprise a first thickness 108 in certain metallization layers, and a second thickness 106 in other metallization layers, wherein the first thickness is less than the second thickness 106, for example.

Figure 3:
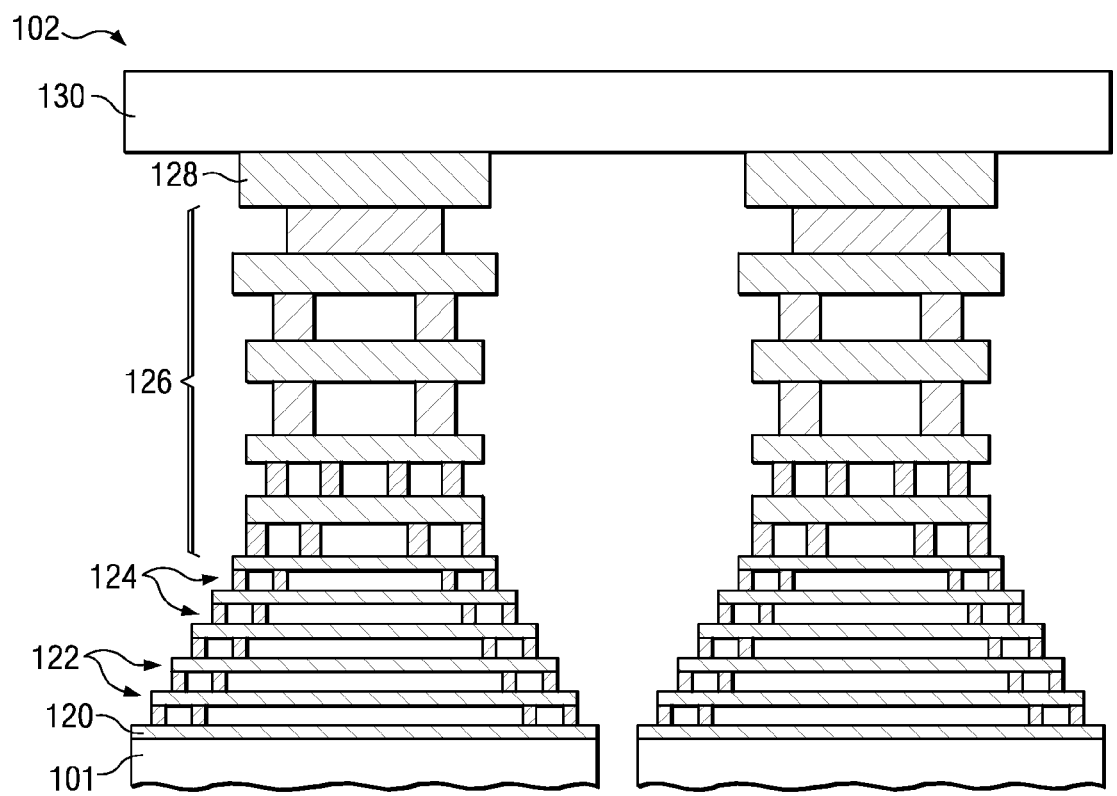
FIG. 3 is a cross-sectional view of the dual line structure moisture barrier shown in FIG. 1, formed in a plurality of metallization layers of an integrated circuit.

FIG. 3 is a cross-sectional view of the dual line structure moisture barrier 102 shown in FIG. 1 formed in a plurality of metallization layers of an integrated circuit. The moisture barrier 102 may comprise a pyramid type structure, with the width of the metallization of the moisture barrier 102 being thinner in the top levels than in the bottom levels, for example, as shown.

Figure 4:
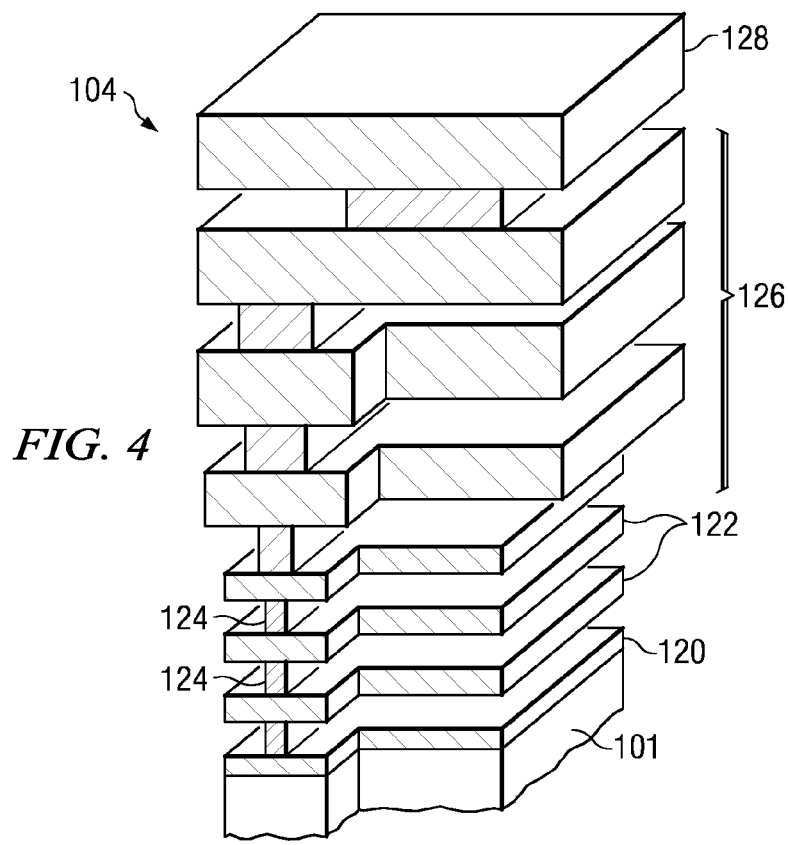
FIG. 4 is a perspective view of the crack stop shown in FIG. 1.

The semiconductor device includes a workpiece 101 which may comprise a semiconductor wafer or substrate having circuits formed thereon in active areas 110 (see FIG. 1) of the device. A first conductive layer 120 is formed over the workpiece 101. The first conductive layer 120 may comprise a silicon layer or a metallization layer, as examples. The moisture barrier 102 may be thicker in this first conductive layer 120 than in the other metallization layers 122, 124, 126 and 128, for example. Metallization layers 122 comprise conductive line layers and metallization layers 124 comprise via layers that connect adjacent conductive line layers 122, for example. The upper metallization layers 126 and 128 have a decreased width compared to layers 122 and 120, as shown. A final passivation layer 130 is formed over the layers 120, 122, 124, 126 and 128. The layers 120, 122, 124, 126 and 128 may be formed in a "back end of line" (BEOL) phase of the manufacturing process, for example. The layers 120, 122, 124, 126, and 128 may be formed using a subtractive etch process, a damascene process, or both, for example. FIG. 4 shows a perspective view of the crack stop 104 shown in FIG. 1, formed in the same metallization layers as were described for the moisture barrier 102 in FIG. 3.

Referring again to FIG. 3, the moisture barrier 102 comprises two long lines that extend along the entire edge of integrated circuits formed on a semiconductor wafer. One problem with the moisture barrier 102 is that the long lines may be difficult to etch with reactive ion etch (RIE) processes that are used to pattern the metallization layers. For example, the long lines may have a high aspect ratio, which may have a tendency to collapse. This is often referred to in the art as "lagging."

Thus, what is needed in the art is a crack prevention and moisture barrier structure that is compatible with etch processes used for patterning interconnect structures.

Figure 5:
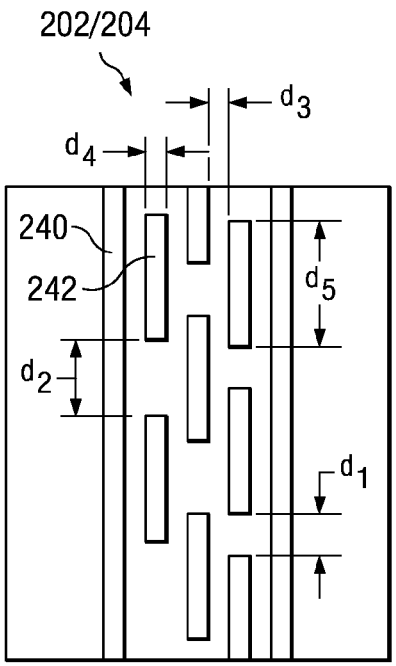
FIG. 5 shows a top view of a crack stop and/or moisture barrier structure in accordance with a preferred embodiment of the present invention, comprising a plurality of staggered discrete conductive features.

FIG. 5 shows a top view of a crack stop and/or moisture barrier structure 202/204 in accordance with a preferred embodiment of the present invention, comprising a plurality of staggered discrete conductive features 242 formed at a peripheral region of an integrated circuit proximate a scribe line. In this embodiment, the discrete conductive features 242 comprise line segments that extend vertically along the length of an edge of an integrated circuit. For example, the line segments 242 may be spaced apart within each row by a distance $d_1$ to $d_2$, wherein $d_1$ is about 0.09 µm to 0.18 µm and $d_2$ is greater than about 0.21 µm, as examples. Preferably, the line segments 242 in each row are spaced apart by about 0.09 µm to 0.18 µm and greater than about 0.21 µm, although alternatively, the line segments 242 may be spaced apart by other dimensions. The line segments 242 preferably are arranged in a plurality of rows, with each row being spaced apart from an adjacent row by a distance $d_3$ of about 0.09 µm to 0.18 µm, or greater than about 0.21 µm. The line segments in adjacent rows are preferably staggered, as shown. The line segments 242 preferably comprise a width $d_4$ of about 0.09 µm and a length $d_5$ of greater than about 1.0 µm, as examples, although alternatively, the line segments 242 may comprise other dimensions.

The preferred dimensions previously described herein are exemplary for 65 nm node technology, for example. As the minimum feature size of semiconductor devices is decreased in the industry, the preferred dimensions of the novel discrete conductive features 242 described herein would preferably be decreased in size (scaled) accordingly, e.g., approximately proportionately as the minimum feature size is decreased. Thus, in accordance with an embodiment of the present invention, the width of the discrete conductive features 242 is preferably about 0.09 µm or less, and the length of the discrete conductive features 242 is preferably about 1.0 µm or less, although alternatively, the discrete conductive features 242 may comprise other dimensions. For example, the aspect ratio of the length to the width is preferably about 3:1 to about 10:1, in one embodiment of the present invention. If the discrete conductive features 242 are used in larger minimum feature size applications, the dimensions may be increased accordingly, for example.

In one embodiment, the structure 202/204 comprises a crack stop that may be used alone at the edge of each die manufactured on a wafer, or in conjunction with a moisture barrier structure such as the one shown in FIG. 1 at 102. Alternatively, the structure 202/204 comprises a moisture barrier that may be used alone, or in conjunction with a crack stop such as the one shown in FIG. 1 at 104. Alternatively, one wide structure 202/204 may be implemented that functions as both a crack stop and a moisture barrier, for example. The width of a single wide combination crack stop/moisture barrier 202/204 may comprise about 5 μm or greater, for example, and may comprise a dozen or more rows of discrete conductive features 242. In yet another embodiment, one or more structure 202/204 may be implemented along the edge or peripheral region of an integrated circuit, for example.

The crack stop/moisture barrier 202/204 may include one or more optional continuous conductive lines 240 proximate the plurality of discrete conductive features 242, as shown in FIG. 5. For example, in one embodiment, the crack stop/moisture barrier 202/204 includes a first continuous conductive line 240 disposed on a first side of the plurality of discrete conductive features 242, and a second continuous conductive line 240 disposed on a second side opposite the first side of the plurality of discrete conductive features 242.

The discrete conductive features 242 are preferably formed in one or more metallization layers of the integrated circuit, such as the metallization layers shown in FIG. 3, for example. The discrete conductive features 242 may be formed in conductive line layers 120, 122, 126, 128 and/or via layers 124. The via layers 124 may be shaped with the discrete conductive feature 242 pattern to ensure connection between the metallization layers, for example. For example, in one embodiment, one or more of the conductive line layers 120, 122, 126, 128 and via layers 124 may comprise a plurality of the discrete conductive features 242 connected vertically and comprising substantially the same shape. In one embodiment, the discrete conductive features 242 are preferably connected to conductive lines for ground that comprise wide metal lines, for example (not shown). Alternatively, the discrete conductive features 242 may be connected electrically to active regions of the integrated circuit, or the discrete conductive features 242 may not be connected electrically to other areas of the integrated circuit, as examples.

Figure 6:
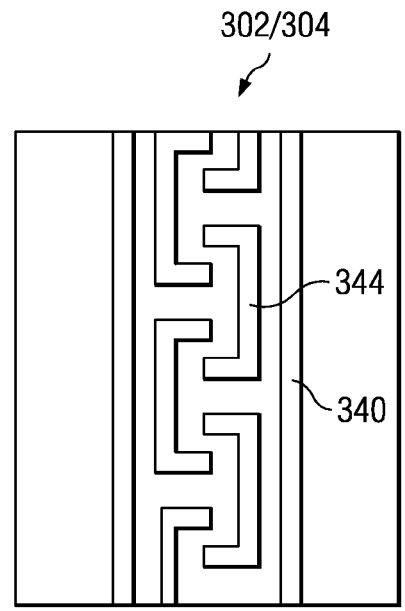
FIG. 6 shows a top view of another preferred embodiment of the present invention, wherein a crack stop and/or moisture barrier structure comprises a plurality of horseshoe-shaped conductive features.

FIG. 6 shows a top view of another preferred embodiment of the present invention, wherein the discrete conductive features of the crack stop and/or moisture barrier structure 302/304 comprise a plurality of horseshoe-shaped conductive features 344, preferably arranged in at least one row, as shown. The horseshoe shaped conductive features 344 may be chained, as shown, in one embodiment. For example, the crack stop/moisture barrier 302/304 may include at least two rows of the plurality of horseshoe-shaped conductive lines 344, wherein each of the plurality of horseshoe-shaped conductive lines 344 comprises an opening, a first end, and a second end, wherein the first end and the second end are disposed about the opening. In this embodiment, preferably, the openings of the plurality of horseshoe-shaped conductive lines 344 in a first row face the openings of the plurality of horseshoe-shaped conductive lines 344 in a second row. A first end of at least one of the plurality of horseshoe-shaped conductive lines 344 in the first row preferably extends into the opening of one of the horseshoe-shaped conductive lines 344 in the second row, and a second end of at least one of the plurality of horseshoe-shaped conductive lines 344 in the first row extends into the opening of another one of the horseshoe-shaped conductive lines 344 in the second row, as shown. Thus, in this embodiment, the discrete conductive features comprise horseshoe-shaped conductive lines 344 in adjacent rows that are staggered and also chained.

Again, as in the embodiment shown in FIG. 5, the crack stop/moisture barrier 302/304 may include one or more optional continuous conductive lines 340 proximate the plurality of discrete conductive features 344.

Figure 7:
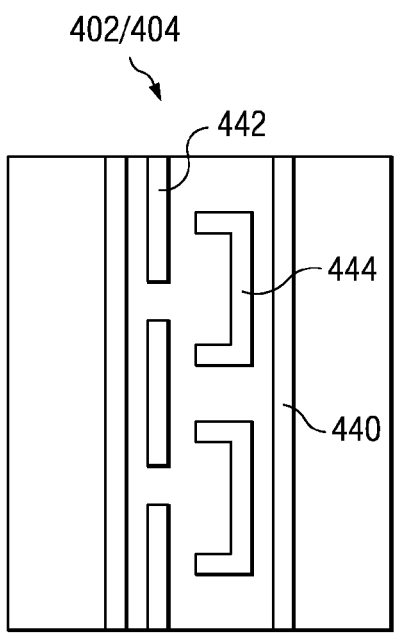
FIG. 7 shows a top view of another preferred embodiment of the present invention, wherein a crack stop and/or moisture barrier structure comprises a combination of a plurality of staggered discrete conductive lines and a plurality of horseshoe-shaped conductive features.

FIG. 7 shows a top view of yet another preferred embodiment of the present invention, wherein a crack stop and/or moisture barrier structure 402/404 comprises a combination of a plurality of staggered discrete conductive lines 442 and a plurality of horseshoe-shaped conductive features 444. Preferably one or more rows of discrete conductive lines 442 is combined with one or more rows of a plurality of horseshoe-shaped conductive features 444, as shown. Thus, embodiments of the invention include a crack stop and/or moisture barrier 402/404 comprising discrete conductive features comprising a plurality of staggered lines 442, a plurality of horseshoe-shaped lines 444, or a combination of both. Again, the crack stop/moisture barrier 402/404 may include one or more optional continuous conductive lines 440 proximate the plurality of discrete conductive features 444.

Figure 8:
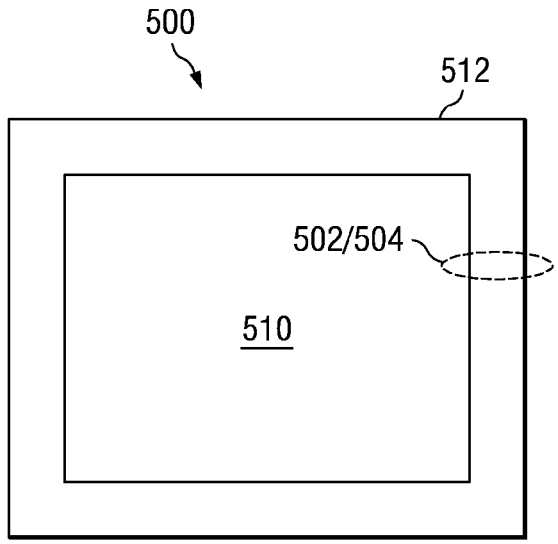
FIG. 8 shows a top view of an integrated circuit manufactured in accordance with preferred embodiments of the present invention.

FIG. 8 shows a top view of an integrated circuit 500 manufactured in accordance with preferred embodiments of the present invention. The integrated circuit 500 comprises a single die having an active region 510 comprising electrical circuits formed thereon, for example. The novel crack stop/moisture barriers 502/504 (and also crack stop/moisture barriers 202/204, 302/304, and 402/404 described herein with reference to FIGS. 5, 6, and 7, respectively) are formed at an outer edge or peripheral region of the integrated circuit 510 proximate a scribe line 512. The integrated circuit 500 may be one of many integrated circuits 500 formed on a wafer, which are singulated along the scribe line 512 after the manufacturing of the integrated circuits 500 is complete, for example.

Embodiments of the present invention include semiconductor devices comprising the novel crack stop/moisture barriers 202/204, 302/304, 402/404, and 502/504 described herein, and also comprise methods of manufacturing semiconductor devices including the crack stop/moisture barriers 202/204, 302/304, 402/404, and 502/504, for example. Referring again to FIG. 8, in one embodiment, a method of manufacturing a semiconductor device includes manufacturing a plurality of integrated circuits 500 on a semiconductor wafer, each of the integrated circuits comprising a peripheral region. A crack prevention structure 502/504 is formed proximate the peripheral region of each of the plurality of integrated circuits 500, the crack prevention structure 502/504 comprising a plurality of discrete conductive features (such as features 442 and/or 444 shown in FIG. 7). The plurality of integrated circuits 500 are then separated from one another proximate the crack prevention structure 502/504 of each integrated circuit 500.

The novel crack prevention structure and moisture barriers 202/204, 302/304, 402/404, and 502/504 described herein have useful application in virtually all types of integrated circuits, such as logic, power, and memory circuits, for example. They are particularly useful in large integrated circuits having many arrays of devices formed thereon, such as memory devices, for example.

Advantages of preferred embodiments of the present invention include providing a novel crack stop and moisture barrier 202/204, 302/304, 402/404, and 502/504 that is easily implemented into semiconductor designs. Because the crack stop 202/204, 302/304, 402/404, and 502/504 comprises a plurality of discrete features, etch processes to form the crack stop are readily implemented into manufacturing processes, and RIE lag burden is relieved. The discrete conductive features are elongated and staggered, to provide an increased process window for process integration of the semiconductor device. CMP dishing around the chip edge area is reduced by using the discrete conductive features of the present invention, compared to using a large single line, as shown in the less preferred embodiment of FIG. 1. Integrated circuits with good quality and high reliability result from the use of the novel crack stop and moisture barrier 202/204, 302/304, 402/404, and 502/504 designs described herein. RIE performance, especially at a contact level within a metallization structure, is improved.

Because a plurality of discrete conductive features are included in the crack stop and moisture barrier layer, which is a sacrificial feature, more amounts of encroaching moisture are absorbed. The increased moisture absorption of embodiments of the present invention is a result of increased oxidation of the metal shapes of the discrete conductive features, which consume themselves from metal to metal oxide derivatives, for each layer. Thus, more moisture is absorbed, compared to the single or dual continuous long conductive line shown in FIG. 1. Also, due to this advantage, the width of the barrier pattern 202/204 may be reduced, freeing up space on the integrated circuit, which may be used for active areas. The plurality of conductive features is preferably grounded to the silicon substrate from an external electrical connection, in one embodiment. The plurality of discrete conductive features have reduced resistance compared to a continuous conductive line shown in FIG. 1, in one embodiment.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    manufacturing a plurality of integrated circuits on a semiconductor wafer, each integrated circuit of the plurality of integrated circuits comprising a peripheral region proximate an edge;
    forming a barrier structure comprising a integrated moisture barrier and a crack stop proximate the peripheral region of each of the plurality of integrated circuits, the barrier structure comprising discrete conductive features, wherein a length of the discrete conductive features is larger than a width or a height of the discrete conductive features, wherein the discrete conductive features are arranged around each of the integrated circuit along the length in a plurality of parallel rows in a plane disposed parallel to a top surface of the semiconductor device, wherein the discrete conductive features are discontinuous along the length, wherein the discrete conductive features comprises first horseshoe-shaped features arranged in a first row and second horseshoe-shaped features arranged in a second row, the second row being parallel to the first row, wherein each of the first horseshoe-shaped features has an opening in a direction opposite to an opening of at least one adjacent second horseshoe-shaped feature of the second horseshoe-shaped features; and
    separating the plurality of integrated circuits from one another proximate the barrier structure of each integrated circuit.

2. The method according to claim 1, wherein the discrete conductive features of the barrier structure further comprises a plurality of lines arranged in at least one row, wherein discrete conductive features in adjacent rows are staggered.

3. The method according to claim 1, wherein the discrete conductive features further comprises a plurality of staggered discrete lines.

4. The method according to claim 3, wherein the staggered discrete lines in adjacent parallel rows are staggered.

5. The method according to claim 1, wherein the discrete conductive features of the barrier structure comprises a plurality of horseshoe-shaped lines.

6. The method according to claim 1, wherein the plurality of discrete conductive features of the barrier structure comprises a plurality of staggered discrete lines and a plurality of horseshoe-shaped lines.

7. The method according to claim 1, wherein each of the discrete conductive features comprises a width of about 0.09 µm or less and a length of about 1.0 µm or less.

8. The method according to claim 1, wherein manufacturing a plurality of integrated circuits comprises forming at least one metallization layer in each of the plurality of integrated circuits, and wherein the discrete conductive features is formed in the at least one metallization layer of each of the integrated circuit.

9. The method according to claim 1, wherein manufacturing a plurality of integrated circuits comprises forming a plurality of metallization layers in each integrated circuit of the plurality of integrated circuits, wherein the discrete conductive feature is formed in at least one of the plurality of metallization layers of each of the integrated circuit.

10. The method according to claim 1, wherein a first end of at least one of the first horseshoe-shaped features in the first row extends into the opening of one of the second horseshoe-shaped features in the second row, and wherein a second end of at least one of the first horseshoe-shaped features in the first row extends into the opening of another one of the second horseshoe-shaped features in the second row.

11. The method according to claim 10, wherein the horseshoe-shaped features in adjacent rows are staggered.

12. A method of forming a semiconductor device, the method comprising:
    forming integrated circuits on a semiconductor wafer, the integrated circuits having inner regions comprising circuitry and peripheral regions surrounding the inner regions, the peripheral regions being proximate edges of the integrated circuits;
    forming a barrier structure disposed on the peripheral region of each integrated circuit of the integrated circuits, the barrier structure comprising discrete conductive features, wherein a length of the discrete conductive features is larger than a width or a height of the discrete conductive features, wherein the discrete conductive features of the barrier structure are arranged along the length in a plurality of parallel rows in a plane disposed parallel to a top surface of the semiconductor device, wherein the discrete conductive features are discontinuous along the length, and wherein the discrete conductive features in adjacent parallel rows are staggered, wherein the discrete conductive features comprises first horseshoe-shaped features arranged in a first row and second horseshoe-shaped features arranged in a second row, the second row being parallel to the first row, wherein each of the first horseshoe-shaped features has an opening in a direction opposite to an opening of at least one adjacent second horseshoe-shaped feature of the second horseshoe-shaped features; and forming single dies by separating the integrated circuits adjacent the edges of the integrated circuits.

13. The method according to claim 12, wherein the discrete conductive features further comprises a plurality of horseshoe-shaped features.

14. The method according to claim 12, wherein the discrete conductive features further comprises a plurality of staggered discrete lines and a plurality of horseshoe-shaped features.

15. The method according to claim 12, wherein forming the barrier structure comprises forming an integrated moisture barrier and crack stop.

16. The method according to claim 12, wherein the barrier structure is the only structure having conductive features in the peripheral regions between the inner regions of the integrated circuits and the edges of the integrated circuits, and wherein all conductive features within the barrier structure in a plane parallel to the top surface of the semiconductor wafer comprise a discrete conductive feature of the discrete conductive features.

17. A method of forming a semiconductor device, the method comprising:

forming integrated circuits on a semiconductor wafer, the integrated circuits having inner regions comprising circuitry and peripheral regions surrounding the inner regions, the peripheral regions being proximate edges of the integrated circuits;

forming metallization layers over the semiconductor wafer, the metallization layers in the peripheral region of each integrated circuit of the integrated circuits comprising a barrier structure, the barrier structure comprising discrete conductive features, wherein the discrete conductive features in adjacent rows are staggered, wherein a length of the discrete conductive features is larger than a width or a height of the discrete conductive features, wherein the discrete conductive features are arranged around each integrated circuit along the length in a plurality of parallel rows in a plane disposed parallel to a top surface of the semiconductor device, wherein the discrete conductive features are discontinuous along the length, wherein the discrete conductive features comprises first horseshoe-shaped features arranged in a first row and second horseshoe-shaped features arranged in a second row, the second row being parallel to the first row, wherein each of the first horseshoe-shaped features has an opening in a direction opposite to an opening of at least one adjacent second horseshoe-shaped feature of the second horseshoe-shaped features; and forming a plurality of dies by singulating the semiconductor wafer along a scribe line adjacent the edges of the integrated circuits.

18. The method of claim 17, wherein the discrete conductive features further comprise a plurality of horseshoe-shaped lines.

19. The method according to claim 17, wherein the discrete conductive features further comprise a plurality of staggered discrete lines and a plurality of horseshoe-shaped features.

20. The method according to claim 1, wherein all conductive features within the barrier structure in the plane parallel to the top surface of the semiconductor device comprise a discrete conductive feature of the plurality of discrete conductive features.

21. The method according to claim 1, wherein the discrete conductive features are the only barrier structure between each of the integrated circuit and the edge of each of the integrated circuit.

* * * * *